United States Patent
Akasaki et al.

[11] Patent Number: 5,846,844
[45] Date of Patent: Dec. 8, 1998

[54] METHOD FOR PRODUCING GROUP III NITRIDE COMPOUND SEMICONDUCTOR SUBSTRATES USING ZNO RELEASE LAYERS

[75] Inventors: Isamu Akasaki; Hiroshi Amano, both of Nagoya; Kazumasa Hiramatsu, Yokkaichi; Theeradetch Detchprohm, Nagoya, all of Japan

[73] Assignees: Toyoda Gosei Co., Ltd., Nishikasugai-gun; Isamu Akasaki; Hiroshi Amano, both of Nagoya; Kazumasa Hiramatsu, Yokkaichi, all of Japan

[21] Appl. No.: 598,134

[22] Filed: Feb. 7, 1996

Related U.S. Application Data

[63] Continuation of Ser. No. 158,252, Nov. 29, 1993, abandoned.

[51] Int. Cl.[6] ............................. H01L 21/20; H01L 21/84
[52] U.S. Cl. ..................... 437/21; 437/84; 437/86; 437/133; 437/944; 437/974; 117/915; 117/952; 148/DIG. 65; 148/DIG. 113; 148/DIG. 135
[58] Field of Search ................... 148/33.4, DIG. 135, 148/33.5, DIG. 65, DIG. 100, DIG. 113; 437/21, 84, 86, 110, 133, 944, 974; 216/40; 117/915, 922, 952; 156/636.1

[56] References Cited

U.S. PATENT DOCUMENTS

| | | | |
|---|---|---|---|
| 4,116,751 | 9/1978 | Zaromb | 148/DIG. 135 |
| 4,255,208 | 3/1981 | Deutscher | 148/DIG. 135 |
| 4,956,335 | 9/1990 | Agostinelli et al. | 156/636.1 |
| 5,173,451 | 12/1992 | Ota | 257/76 |
| 5,270,294 | 12/1993 | Wu et al. | 505/1 |
| 5,278,435 | 1/1994 | Van Hove | 257/184 |
| 5,280,184 | 1/1994 | Jokerst et al. | 437/944 |
| 5,286,335 | 2/1994 | Drabik | 148/DIG. 135 |
| 5,391,257 | 2/1995 | Sullivan et al. | 437/86 |

OTHER PUBLICATIONS

*Hackh's Chemical Dictionary*, 4th Ed McGraw–Hill, NY, NY (1972) p. 735.

T. Detchprohm et al., Alloy Semic. Phys. & Electron. Symp. 1991, p. 121 "Crystal growth and properties of thick GaN layer on sapphire substrate", Jul. 1991.

Matsuoka et al, "Wide–Gap Semiconductor InGaN and InGaAlN Grown by Movpe", *Journal of Electronic Materials*, 21, 157–163, No. 2, 1992.

Detchprohm. et al. "Hydride Vapor Phase Epitaxial Growth of a High Quality GaN Film Using a ZnO Buffer Layer". Applied Physics. Letters. vol. 61 No. (22). Nov. 30, 1992 pp. 2688–2660.

Detchprohm. et al. "The Growth of Thick GaN Film on Sapphire Substrate by Using ZnO Buffer Layer". Journal of Crystal Growth 128. 1983. pp. 384–390.

*Primary Examiner*—Charles L. Bowers, Jr.
*Assistant Examiner*—Leon Radomsky
*Attorney, Agent, or Firm*—Cushman, Darby & Cushman IP Group of Pillsbury Madison & Sutro LLP

[57] ABSTRACT

A nitrogen-group III compound semiconductor satisfying the formula $Al_xGa_yIn_{1-x-y}N$, inclusive of x=0, y=0 and x=y=0, and a method for producing the same comprising the steps of forming a zinc oxide (ZnO) intermediate layer on a sapphire substrate, forming a nitrogen-group III semiconductor layer satisfying the formula $Al_xGa_yIn_{1-x-y}N$, inclusive of x=0, y=0 and x=y=0 on the intermediate ZnO layer, and separating the intermediate ZnO layer by wet etching with an etching liquid only for the ZnO layer.

4 Claims, 3 Drawing Sheets

METHOD FOR PRODUCING GROUP III NITRIDE COMPOUND SEMICONDUCTOR SUBSTRATES USING ZNO RELEASE LAYERS

This is a continuation of application Ser. No. 08/158,252, filed on Nov. 29, 1993, which was abandoned.

BACKGROUND OF THE INVENTION

1. Field of the Invention

The present invention relates to an epitaxial substrate of nitrogen-group III compound and a method for producing the same.

2. Description of the Prior Art

It has been known that a GaN compound semiconductor may be used to obtain a light-emitting diode (LED) which emits blue light. This semiconductor is useful, because of its high luminous efficiency resulting from direct electron transition and because of its ability to emit blue light, which is one of the three primary colors.

A nitrogen-group III compound semiconductor satisfying the formula $Al_xGa_yIn_{1-x-y}N$, inclusive of x=0, y=0 and x=y=0 is also known as a material of the LED which emits light in entire visible and ultraviolet regions. This semiconductor is useful, because it has an energy band gap equivalent to wavelength of 200 to 650 nm and has a characteristic of direct electron transition. Especially, this semiconductor has been researched for an application to a material of LEDs which is capable of emitting light in visible short wave length region and in ultra-violet region.

It, however, has been difficult to produce a single crystalline bulk of nitrogen-group III compound semiconductor, because the equilibrium vapor pressure of nitrogen is high at growth temperature of the semiconductor. Therefore it has been inevitable to produce and employ the semiconductor which grows epitaxially on a sapphire substrate.

A devise using that semiconductor has had structural limitations of forming an electrode, taking out light and so on, because of accompanying a sapphire substrate with itself. As a concrete example, problems of forming an electrode on a conventional LED will be described in the next paragraph.

An insulative sapphire substrate prevents electrodes for a p-layer and an n-layer on the sapphire substrate from being formed sandwiching the two layers. The electrodes for those two layers have been formed on a surface layer of the LED. Accordingly, the structure of the LED has inevitably required several manufacturing processes to form a groove which insulate these two electrodes from each other and a hole in which the electrode for an either lower layer of the two, the p-layer or the n-layer, will be formed. It is also required to feed currents parallel to the surface of the lower layer. Accordingly, there have existed problems that increase of resistance of a LED enlarges a voltage drop and a generating amount of Joule heat.

SUMMARY OF THE INVENTION

It is an object of the present invention to produce a substrate of a nitrogen-group III compound semiconductor satisfying the formula $Al_xGa_yIn_{1-x-y}N$, inclusive of x=0, y=0 and x=y=0 easily.

It is another object of the present invention to produce a LED employing the single crystalline substrate prepared along with the first object.

One novel feature of the present invention resides in a method for producing a nitrofen-group III compound semiconductor satisfying the formula $Al_xGa_yIn_{1-x-y}N$, inclusive of x=0, y=0 and x=y=0 comprising the steps of forming an intermediate zinc oxide (ZnO) layer on a sapphire substrate, forming a nitrogen-group III semiconductor layer satisfying the formula $Al_xGa_yIn_{1-x-y}N$, inclusive of x=0, y=0 and x=y=0 on the intermediate ZnO layer, and peeling off the intermediate ZnO layer by wet etching with an etching liquid capable of etching ZnO.

Another novel feature of the invention resides in a semiconductor prepared by the above-described method.

The other novel feature of the invention resides in a LED formed on the substrate prepared by the above-described method.

DETAILED DESCRIPTION OF THE INVENTION

The invention will be more fully understood by reference to the following example.

EXAMPLE

Figure 1:
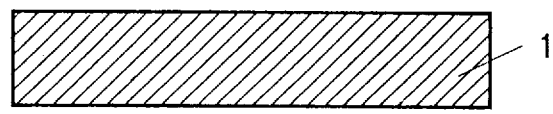
FIGS. 1, 2 and 3 are sectional views illustrating a method for producing a GaN substrate embodied in an Example in accordance with the principle of the present invention.
Figure 2:
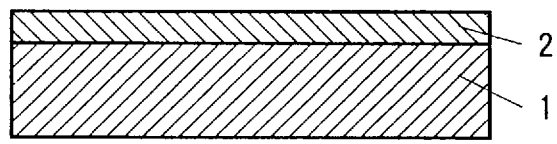
Figure 3:
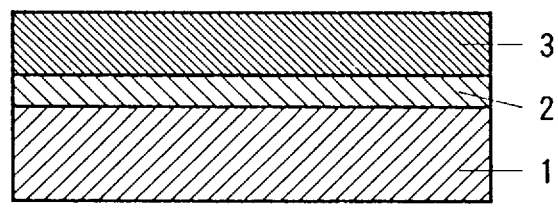
Figure 4:
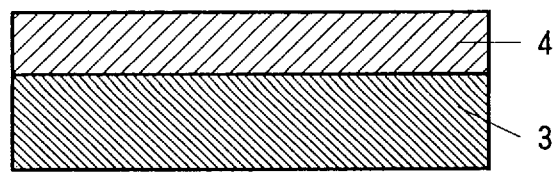
FIGS. 4, 5 and 6 are sectional views illustrating a method for producing the GaN LED embodied in an Example in accordance with the principle of the present invention.

FIGS. 1 to 3 show a series of process producing for a gallium-nitrogen (GaN) compound semiconductor device.

As shown in FIG. 1, a c(0001)-oriented single crystalline sapphire substrate 1 which was cleaned by organic washing solvent such as methyl alcohol, was placed on a susceptor in a chamber for RF sputtering. After the chamber was pumped up to about $10^{-5}$ Torr, a mixed gas of argon (Ar) and oxygen ($O_2$) was released for sputtering ZnO(5N) ceramic disc. Thereby, the intermediate ZnO layer 2 of 100 nm thickness was deposited on the sapphire substrate 1 as shown in FIG. 2. The intermediate layer 2 had strong degree of orientation towards c-axis.

For the purpose of producing a GaN semiconductor layer 3 as shown in FIG. 3, the sapphire substrate with the intermediate ZnO layer 2 thereon was placed in a chamber for hydride vapor phase epitaxy treatment. After the chamber was pumped off, nitride gas was discharged therein and the sapphire substrate was heated up to 1090° C., which is suitable for the growth of single crystalline GaN on the sapphire substrate 1. Accordingly, the degree of orientation of the intermediate ZnO layer 2 was improved and it became possible to grow single crystalline GaN thereon.

GaCl which was produced by the reaction of Ga and hydrogen chloride (HCl) at high temperature was employed as a material gas for the growth of gallium (Ga). Ammonia was used as a material gas for nitrogen (N). GaCl and Ammonia were released over the surface of the sapphire substrate 1 for GaN growth. As shown in FIG. 3, a GaN semiconductor layer 3 of 300 $\mu$m thickness was obtained by growing for five hours.

Then, the sapphire substrate 1 which had the intermediate ZnO layer 2 and the GaN semiconductor layer 3 thereon was dipped into an etching liquid of acid such as aqua regia.

After the etching liquid was heated up to 60° C., the intermediate ZnO layer 2 was etched off by the liquid with ultrasonic wave for ten minutes and the GaN semiconductor layer 3 was peeled off from the sapphire substrate 1. The obtained GaN semiconductor layer 3 showed n-type conductivity, which had electron concentration of about $3 \times 10^{17}$ cm$^{-3}$ and mobility of about 400 cm$^2$/V·s at room temperature.

Then, a LED 10 was produced on the GaN semiconductor layer 3 of 300 μm thickness as a substrate by gaseous phase growth, called metal organic vapor phase epitaxy. This process is referred to as MOVPE hereinafter.

The gases employed in this process were NH$_3$, a carrier gas (H$_2$), trimethyl gallium (Ga(CH$_3$)$_3$) (TMG hereinafter), trimethyl aluminum (Al(CH$_3$)$_3$) (TMA hereinafter), silane (SiH$_4$), biscyclopentadienyl magnesium (Mg(C$_5$H$_5$)$_2$) (Cp$_2$Mg hereinafter) and diethylzinc (DEZ hereinafter).

The GaN semiconductor substrate 3 was placed on a susceptor in a reaction chamber for the MOVPE treatment. After the chamber was pumped out, H$_2$ and NH$_3$ were released thereto, heating up the temperature of the GaN semiconductor substrate 3 to 1090° C. Feeding NH$_3$ is necessary to prevent molecules of GaN from sublimating from the semiconductor layer 3 into the air.

Then, a 1 μm thick GaN buffer layer 4 of n-type was formed on the GaN semiconductor substrate 3, under the conditions of supplying H$_2$, NH$_3$, TMG and diluted silane to 0.86 ppm by H$_2$ for ten minutes at a flow rate of 20 liter/min., 10 liter/min., $1.7 \times 10^{-4}$ mol/min. and 200 ml/min. respectively.

Figure 5:
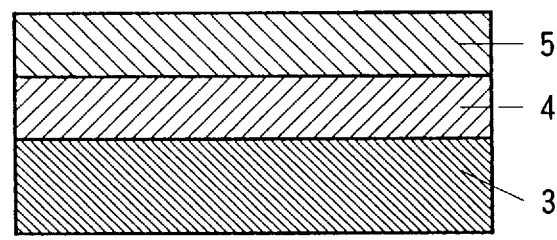

As shown in FIG. 5, a GaN I-layer 5 of 0.5 μm thickness was formed on the GaN buffer layer 4 under the conditions of keeping the temperature of the GaN semiconductor layer 3 at 900° C. and supplying H$_2$, NH$_3$, TMG and CP$_2$Mg for five minutes at a flow rate of 20 liter/min., 10 liter/min., $1.7 \times 10^{-4}$ mol/min. and $2 \times 10^{-7}$ mol/min. respectively. The I-layer 5 remained insulative.

Then electron rays were uniformly irradiated into the I-layer 5. The conditions of the irradiation were set at 10 kv of accelerating voltage, 1 μA of sample current, 0.2 mm/sec. of speed for beam scanning, 60 μmφ of beam aperture and $2.1 \times 10^{-5}$ Torr of vacuum. This irradiation changed the insulative I-layer 5 with resistivity of $10^8$ Ωcm or more into a p-type conductive semiconductor with resistivity of 40 Ωcm.

Thereby, the p-layer 5 of p-type was obtained. Accordingly, a wafer of multi structural layers was obtained as shown in FIG. 5.

Figure 6:
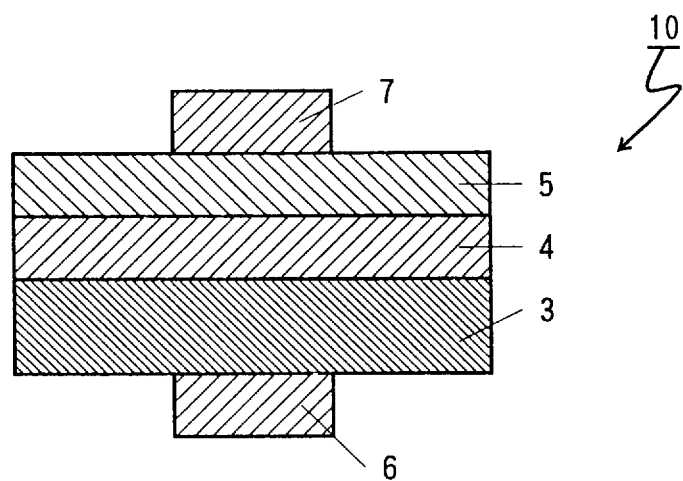

As shown in FIG. 6, two electrodes with 1 mmφ diameter were formed. An electrode 7 was formed on the p-layer 5 by laminating gold (Au) thereon. An electrode 6 was formed on the GaN semiconductor substrate 3 of n-layer by laminating aluminum (Al).

The obtained LED 10 with a PN junction was found that the serial resistance of the n-layer 3 and the n-layer 4 is 0.2Ω. A conventional LED, which has a hole from the surface of a p-layer 5 reaching to an n-layer and an electrode for the n-layer 3 being formed through the hole, has serial resistance of 50Ω in connection of the n-layer 3 and the n-layer 4. In contrast, the resistance of the LED 10 in the present invention decreased to one two-hundred fiftieth of that of the conventional LED.

Figure 7:
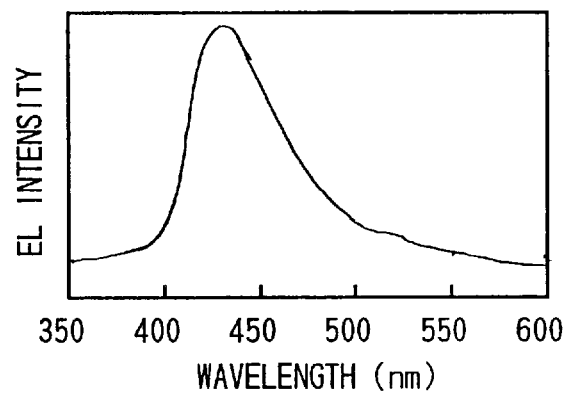
FIG. 7 is a luminous characteristic feature of the LED in Example.

FIG. 7 shows a luminous characteristic feature of the LED 10 at a drive current of 10 mA. The LED 10 was found that the peak wavelength is 450 nm and that blue light is emitted. It was also found that luminous efficiency of the LED 10 is twice as much as that of a conventional LED.

Thickness of the intermediate ZnO layer 2 is 100 nm in the present embodiment. Alternatively, 10 nm to 1 μm of thickness can be used in that range.

A LED which has a PN structure is employed in the present embodiment. Alternatively, a LED which has a PIN structure or a MIS structure can be used.

GaN is used as a substrate of the LED 10 in the present embodiment. Alternatively, InGaN or AlGaN can be employed as a substrate.

A LED which has a heterogeneous junction of different semiconductor materials can be used as an alternate.

What is claimed is:

1. A method for producing a semiconductor comprising the steps of:

forming an intermediate zinc oxide (ZnO) layer on a sapphire substrate, said immediate ZnO layer having a thickness of about 10 nm to 1 μm;

forming a semiconductor substrate on said intermediate ZnO layer, said semiconductor substrate being made of a nitrogen-group III compound satisfying the formula Al$_x$Ga$_y$In$_{l-x-y}$N, inclusive of x=0, y=0 and x=y=0;

etching said intermediate ZnO layer with etching liquid capable of selectively etching ZnO so that the ZnO layer is substantially removed from between the semiconductor substrate and the sapphire substrate;

separating said semiconductor substrate from said sapphire substrate by said etching; and epitaxially growing a semiconductor layer made of nitrogen-group III compound satisfying the formula Al$_x$Ga$_y$In$_{1-x-y}$N, inclusive of x=0, y=0 and x=y=0 on said semiconductor substrate.

2. The method of claim 1, wherein said semiconductor layer comprises at least an n-type nitrogen-group III compound semiconductor satisfying the formula Al$_x$Ga$_y$In$_{1-x-y}$N, inclusive of x=0, y=0 and x=y=0, and a p-type nitrogen-group III compound semiconductor satisfying the formula Al$_x$Ga$_y$In$_{1-x-y}$N, inclusive of x=0, y=0 and x=y=0.

3. The method of claim 1, wherein said semiconductor substrate includes gallium nitride.

4. The method of claim 1, wherein said ZnO layer is formed on said sapphire substrate by RF sputtering ZnO.

* * * * *